US011277074B2

(12) United States Patent
Gayle, Jr.

(10) Patent No.: US 11,277,074 B2
(45) Date of Patent: Mar. 15, 2022

(54) DUAL STAGE POWER SUPPLY

(71) Applicant: Charles Hugh Gayle, Jr., Charlotte, NC (US)

(72) Inventor: Charles Hugh Gayle, Jr., Charlotte, NC (US)

( * ) Notice: Subject to any disclaimer, the term of this patent is extended or adjusted under 35 U.S.C. 154(b) by 0 days.

(21) Appl. No.: 16/873,527

(22) Filed: Apr. 29, 2020

(65) Prior Publication Data
US 2020/0358364 A1 Nov. 12, 2020

Related U.S. Application Data

(60) Provisional application No. 62/920,522, filed on May 6, 2019.

(51) Int. Cl.
*H02M 3/337* (2006.01)
*H02M 3/335* (2006.01)
*H02M 1/00* (2006.01)

(52) U.S. Cl.
CPC ..... *H02M 3/3374* (2013.01); *H02M 3/33569* (2013.01); *H02M 1/0077* (2021.05)

(58) Field of Classification Search
CPC ........... H02M 3/3374; H02M 3/33569; H02M 2001/0077
See application file for complete search history.

(56) References Cited

U.S. PATENT DOCUMENTS

| | | | |
|---|---|---|---|
| 2008/0190906 A1* | 8/2008 | Aigner | H02M 3/335 219/130.21 |
| 2016/0218618 A1* | 7/2016 | Yin | H02M 3/155 |

\* cited by examiner

*Primary Examiner* — Jue Zhang
(74) *Attorney, Agent, or Firm* — Dorothie Smith; IPS Legal Group, P.A.

(57) ABSTRACT

A power supply consisting of double stages. Wherein one stage generates a high voltage using current methods. While the second stage generator an amperage pulse which is inserted into the high voltage circuit, causing both elements to fuse and operate as one entity.

17 Claims, 3 Drawing Sheets

DUAL STAGE POWER SUPPLY

FIELD OF THE INVENTION

The present invention relates to a dual stage power supply device and more particularly to a device to generate high voltage and high amperage without sacrificing large amount of input power from the supplying source.

SUMMARY OF THE INVENTION

This invention has two independent stages operating at different frequencies. During operation, the voltage stage, generate the high voltage which is determine by the turn ratio of the high frequency transformer T-100. Also, the figures shows a circuit used to generate amp pulse. This amp pulse is connected to T-100 high frequency through several different configuration. It should be noted the amperage circuit is inserted directly into the secondary winding of the transformer T-100 center top.

The letters (F) and (S) on the transformer indicate the transformer winding starting point (S) and the finishing point (F). The letters indicate the transformer center-top for connecting the amperage pulse circuit.

DETAILED DESCRIPTION

This two-stage concept enables the design to operate at extremely high voltage and amperage without sacrificing large amount of input power source. To achieve its objective, both circuits operate independently, and its only contact is during insertion of the amperage pulse, into the secondary winding of the high frequency transformer T-100.

This connection allows small amount of amperage pulse, to produce large amount of wattage due to the high voltage. Both elements are then amplified and filtered using today's know technology and configuration. The frequency used to drive each circuit can be variable from high to low and low to high. However, operating both circuit at the same frequency may work, but not recommended.

Figure 1:
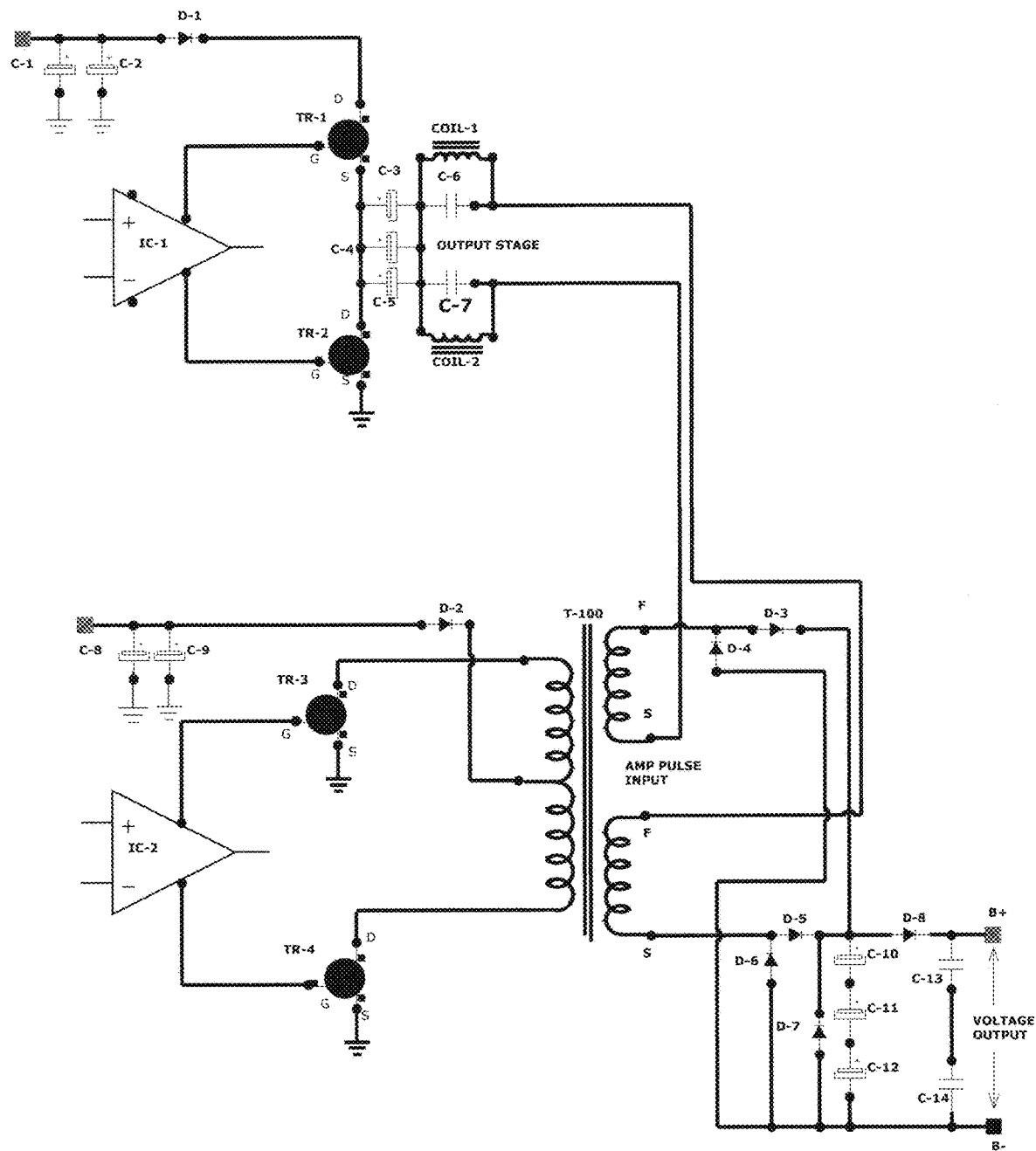
FIG. 1 Illustrates a circuit diagram to generate amp pulse and high voltage of the present invention FIG. 2 Illustrates an amp circuit diagram with a simpler output connection and a high voltage simpler connection.

FIG. 1 drawing shows a circuit used as an amperage generator, designed with two high speed transistors. These components can be replaced, or additional devices can be added to increase output performance of the circuit. Condensers C-3, C-4, and C-5 are blocking components, they prevent high voltage; from the output switching transistors. The frequency of this amp pulse circuitry is high testing. However, the high voltage circuit operates at a lower frequency than the amp circuit.

It should be noted condensers C-6, C-7, Coil-1 and Coil-2 are critical components, they are used to sense the amp pulse and connect to the high voltage transformer T-100. Care should be taken when selecting all these components. The condensers operating voltage should be hundredth of volts high while the coil core should be monitored for extremely high temperature and adjusted.

Figure 2:
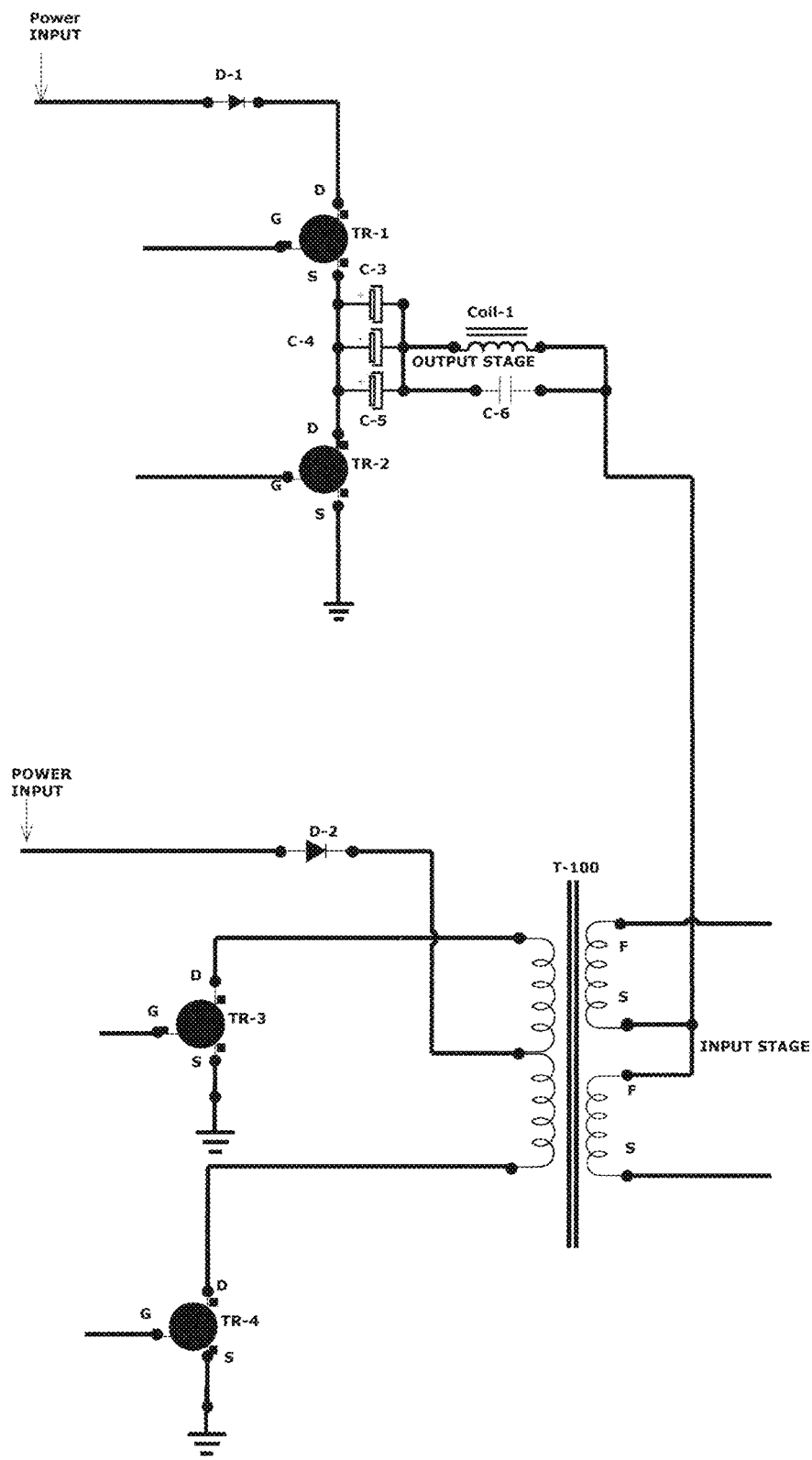

FIG. 2 shows a simpler configuration for the amp pulse generator circuit. It has one sensing coil connected to the center-top of the high voltage transformer. The output of the high voltage transformer is connected to conversion high speed high voltage diodes, and couple with high voltage condensers, form the filtering stage which is known to the industry.

Figure 3:
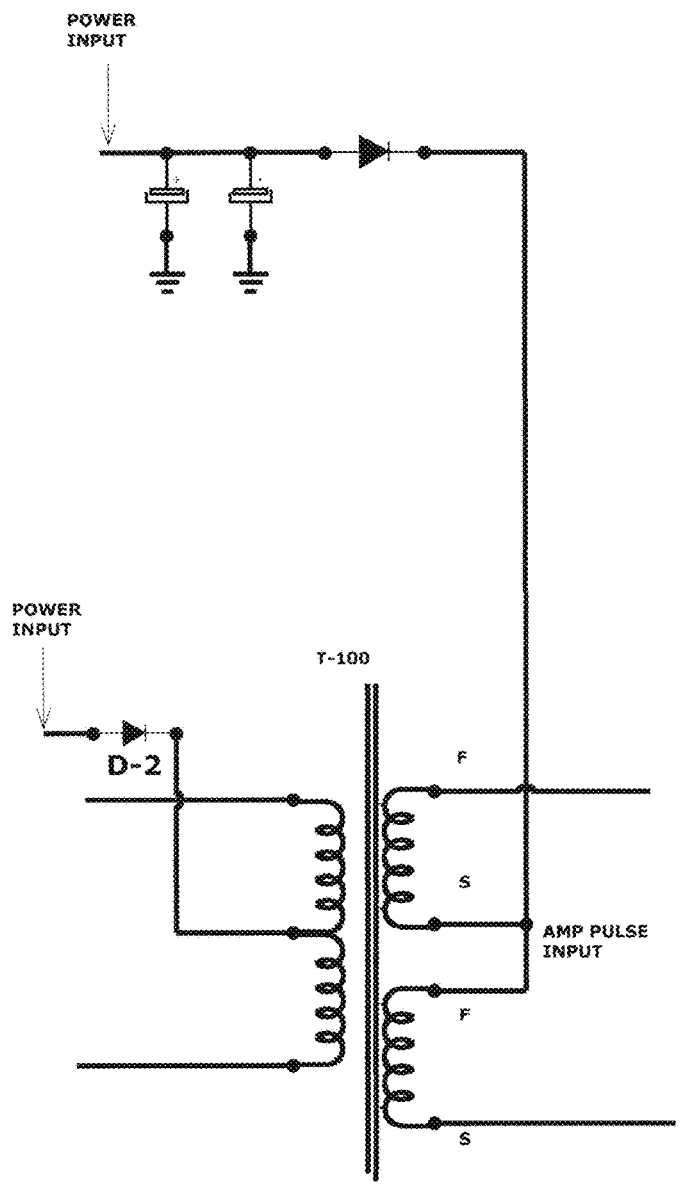
FIG. 3 Illustrates another simpler design and a circuit diagram to add amperage to the transformer.

The current design in not limited to the present configuration and a more complex or simpler design maybe possible. Example, FIG. 3 shows a single diode used to insert power into the high voltage transformer. However, to avoid feed-back on the supply diode-101, input power should never be removed. Therefore, the design is recommended for advance used also extra care should be taken to avoid electrical shock. Finally, IC-1 and IC-2 shown on page-001 are the frequency generator micro-chip.

FIG. 3 illustrates a circuit diagram in accordance with some embodiments of the present invention.

What is claimed is:

1. A dual stage power supply comprising: of
   a first stage to generate a high voltage, wherein the first stage comprise of a high voltage transformer, whereby the high voltage transformer comprise of a first output coil comprising of a first end and a second end, and a secondary output coil comprising of a third end and a fourth end;
   a second stage generating an amperage pulse, wherein the second stage comprise of two resonant converters connected in parallel, wherein the two resonant converters connected in parallel are directly coupled to the secondary output coil of the high voltage transformer;
   wherein both the first stage and second stage are combined to form one entity; and
   wherein the first stage comprises of a first integrated circuit and the second stage comprise of a second integrated circuit.

2. The dual stage power supply of claim 1, wherein the first integrated circuit is a frequency generator for the first stage.

3. The dual stage power supply of claim 1, wherein the second integrated circuit is a frequency generator for the second stage.

4. The dual stage power supply of claim 1, wherein the first stage comprise at least two capacitors coupled in series to a first diode at the first output coil.

5. The dual stage power supply of claim 4, wherein said first diode directly couples to the first end of the first output coil.

6. The dual stage power supply of claim 1, wherein the first end of the first output coil couples to a first high-speed transistor.

7. The dual stage power supply of claim 1, wherein the second end of the first output coil couples to a second high speed transistor.

8. The dual stage power supply of claim 6, wherein said first high-speed transistor is coupled to a first side portion of the first integrated circuit.

9. The dual stage power supply of claim 7, wherein the second high speed transistor is coupled to a second side portion of the first integrated circuit.

10. The dual stage power supply of claim 1, wherein the second output coil is coupled to a set of diodes in series at the third end.

11. The dual stage power supply of claim 1, wherein the second output coil is coupled to a rectifier circuit at the fourth end.

12. The dual stage power supply of claim 11, wherein the rectifier circuit comprise of a set of diodes and a set of capacitors.

13. The dual stage power supply of claim 12, wherein the set of capacitors are connected in parallel to the set of diodes.

14. The dual stage power supply of claim 1, wherein the two resonant converters are connected to at least one capacitor in series.

15. The dual stage power supply of claim 1, wherein the first stage generates a high voltage and low current.

16. The dual stage power supply of claim 1, wherein the second stage generates a low voltage and high current.

17. The dual stage power supply of claim 1, wherein the formed one entity increases the output power transmitted to the load.

* * * * *